(12) United States Patent
Yoshida

(10) Patent No.: US 7,193,158 B2
(45) Date of Patent: Mar. 20, 2007

(54) WIRING BOARD DEVICE

(75) Inventor: Shigehiro Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 150 days.

(21) Appl. No.: 10/414,000

(22) Filed: Apr. 16, 2003

(65) Prior Publication Data
US 2003/0235043 A1    Dec. 25, 2003

(30) Foreign Application Priority Data
Jun. 20, 2002    (JP) ............................. 2002-180437

(51) Int. Cl.
*H05K 1/16* (2006.01)
*H01R 9/00* (2006.01)
(52) U.S. Cl. ...................... 174/260; 361/774
(58) Field of Classification Search ........... 174/260, 174/261; 361/772–776
See application file for complete search history.

(56) References Cited

U.S. PATENT DOCUMENTS 5,067,042 A * 11/1991 Nagano ................. 361/774
5,346,748 A * 9/1994 Yokono ................. 428/209
5,428,505 A * 6/1995 Sakemi et al. ........... 361/777
5,453,582 A * 9/1995 Amano et al. ........... 174/261
5,665,651 A * 9/1997 Asada et al. .............. 29/827
5,951,304 A * 9/1999 Wildes et al. ............. 439/67
6,303,875 B1 * 10/2001 Hata ..................... 174/260
6,388,203 B1 * 5/2002 Rinne et al. ............. 174/261
6,740,822 B2 * 5/2004 Watanabe ............... 174/260

FOREIGN PATENT DOCUMENTS

| EP | 1 026 927 A2 | 8/2000 |
| JP | 04015989 A | 1/1992 |
| JP | 4-245694 A | 9/1992 |
| JP | 061521 A | 6/1994 |

* cited by examiner

*Primary Examiner*—Dean A. Reichard
*Assistant Examiner*—Jeremy C. Norris
(74) *Attorney, Agent, or Firm*—Sughrue Mion, PLLC

(57) ABSTRACT

At the tip of a marginal land of a wiring board corresponding to a marginal electrode of a QFP is provided a partly projecting area that projects in a direction away from another land. The partly projecting area and the marginal land can be formed simultaneously and in a block by applying solder through a mask (not shown) on which openings are formed in the shape of the partly projecting area.

19 Claims, 5 Drawing Sheets

WIRING BOARD DEVICE

BACKGROUND OF THE INVENTION

1. Field of the Invention

The present invention relates to a wiring board device for mounting thereon multi-pod electric components such as an integrated circuit (hereinafter referred to as an IC).

2. Description of the Related Art

As a multi-pod electric component having a plurality of electrodes (pads), a QFP (Quad Flat Package) type IC has been widely known, for instance.

FIG. 6 is a schematic plan view showing an external structure of a QFP. FIG. 7 is a sectional view of FIG. 6 taken along the line VII—VII.

Referring to FIGS. 6, 7, reference numeral 1 denotes a gull wing type QFP, which is made roughly of a substantially rectangular IC body 2 that has four corners 2a and sides 2b, and a plurality of electrodes 3 each arranged along the four sides 2b except the corners 2a of the IC body 2. The electrode 3 is, as shown in FIG. 7, made roughly of a first horizontal section 4 that extends from the side 2b of the IC body 2 in a direction parallel to a surface of the IC body 2, a slanted section 5 that extends from an end of the first horizontal section 4 in a direction crossing to the first horizontal section 4, a second horizontal section 6 that extends from an end of the slanted section 5 in a direction parallel to the first horizontal section 4. Hence the name of this gull wing type QFP.

First Prior Art

Various wiring board devices to mount thereon the above-mentioned gull wing type QFP 1 have been widely known.

FIG. 8 is a schematic plan view partly showing a structure of the conventional wiring board device on which the QFP 1 is mounted.

Referring to the FIG. 8, reference numeral 10 denotes a wiring board, on which a number of lands 11 are arranged to electrically connect by soldering to a number of electrodes 3 of the QFP 1. Respective lands 11 are a strip-shaped area each having the same width along an extending direction of the electrode 3 of the QFP 1. The land 11 is amenable to a well known technique in which a mask (not shown) on which a plurality of strip-shaped openings are formed is positioned for placement on the wiring board 10, followed by applying solder to a predetermined area of the wiring board 10 through the openings of the mask.

An area on the wiring board 10 corresponding to the outside of the corner 2a of the gull wing type QFP 1 in which the electrode 3 is not formed is a row-shaped non-land section 12 where the land is not formed. The non-land section 12 is devoted to formation of etched paths for board patterns (not shown) that extend outwardly from an area on the wiring board 10 under the gull wing type QFP 1.

At a predetermined position of the wiring board 10 of such a wiring board device is positioned the QFP 1 for mounting. Namely, as shown in FIG. 9, the electrode 3 of the QFP 1 is placed on the corresponding land 11 of the wiring board 10, and solder of the land 11 is then melted and re-solidified with the both contacted to each other to electrically connect the QFP 1 to the wiring board 10.

In passing, an IC chip such as the QFP 1 delivered with it received in respective trays (not shown). For this reason, in the event that an electrode of the IC chip such as the QFP 1 contacts, on transportation, to the inner surface of the tray, the electrode is seldom subjected to deformation due to its bending. In case the electrode bends in an inward direction of the array and contacts to another electrode, one is successful in discarding the defective chip as an inferior one through an inspection such as a conductivity test. However, in case a marginal electrode located at an end of the array bends in an outward direction of the array, the IC chip does not contact to another electrode, so that there is the possibility of not being discarded as an inferior chip. In particular, where in the QFP 1, the marginal electrode 3a out of the electrode 3 located at an end bends, as shown in FIG. 9, in a direction away from the array of the electrode 3, for instance, it is likely to be poor electrical connection to the marginal land 11a of the wiring board 10 corresponding to the marginal electrode 3a.

Second Prior Art

The second prior art has been widely known, which is superior to the first prior art in elimination of disadvantages found in the first prior art. The second prior art is intended to entirely widen the width of the marginal land 11a of the wiring board 10 corresponding to the marginal electrode 3a, thereby securing an electrical connection to the bent marginal electrode 3a.

In the second prior art, as shown in FIG. 10, the marginal land 11a of the wiring board 10 is designed to have the width wider than another land 11. The mounting of the QFP 1 on the wiring board device of this kind enables, as shown in FIG. 11, an electrical connection of the bent marginal electrode 3a to the marginal land 11a.

The wiring board device of the second prior art thus structured as above involves as its structural failure problems as follows. That is, the marginal land 11a entirely widened as compared with the first prior art needs more solder at the marginal land 11a of the wiring board 10 of the wiring board device than another land 11. Such structure produces excess solder bolls in soldering by reflow the marginal electrode 3a to the marginal land 11a, and invites degradation of quality as a result of short circuit due to a drop of the solder boll.

Furthermore, the marginal land 11a entirely widened as compared with the first prior art suffers from a narrowed area out of the non-land section 12 near to the corner 2a of the gull wing type QFP 1, which undergoes disadvantages when pulling out the board patterns.

SUMMARY OF THE INVENTION

The present invention has been made to solve the above problems and an object thereof is to provide a wiring board that ensures an electrical connection to multi-pod electric components using a small amount of solder, even when a marginal electrode bends, as well as secures the liberty of pulling out board patterns.

A wiring board device according to the present invention includes a wiring board for mounting thereon multi-pod electric components having a plurality of electrodes arranged at a side; and a plurality of lands, arranged on the wiring board, for electrically connecting to the electrodes of the multi-pod electric components; wherein a partly projecting area that is provided at the tip of a marginal land corresponding to the marginal electrode of the multi-pod electric components out of the plurality of lands, and projects in a direction away from anther land.

According to the present invention, in the wiring board device including the wiring board for mounting thereon the multi-pod electric components having the plurality of electrodes arranged at the side; and the plurality of lands, arranged on the wiring board, for electrically connecting to the electrodes of the multi-pod electric components; the partly projecting area that is provided at the tip of the marginal land corresponding to the marginal electrode of the multi-pod electric components out of the plurality of lands, and projects in a direction away from anther land.

This ensures an electrical connection to the multi-pod electric components, even when the marginal electrode bends. The mounting of the multi-pod electric components using a small amount of solder obviates production of solder bolls, and prevents degradation of quality without occurring short circuit due to the solder bolls.

The above and other objects and the attendant advantages of the invention will become readily apparent by referring to the following detailed description when considered in conjunction with the accompanying drawings

BRIEF DESCRIPTION OF THE DRAWINGS

Throughout the figures, the same reference numerals, and characters, unless otherwise noted, are used to denote like features, elements, components, or portions of the illustrated embodiment.

DESCRIPTION OF THE PREFERRED EMBODIMENTS

The preferred embodiments of the present invention will be described in details with reference to the attached drawings.

First Embodiment

Figure 1:
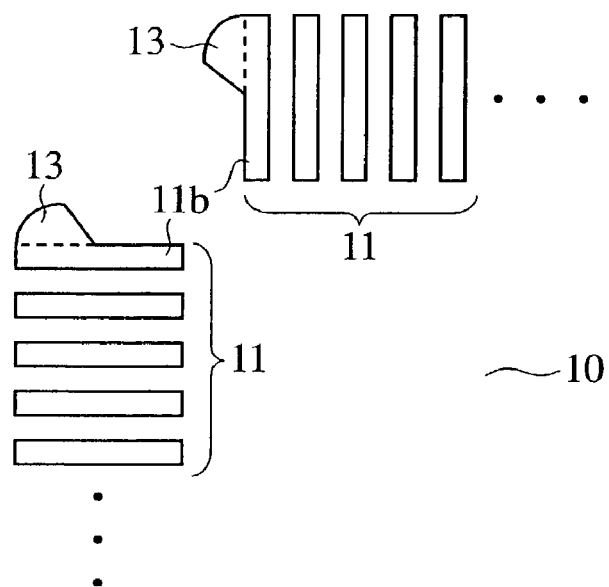
FIG. 1 is a schematic plan view showing the purview of a wiring board device of a first embodiment.
Figure 2:
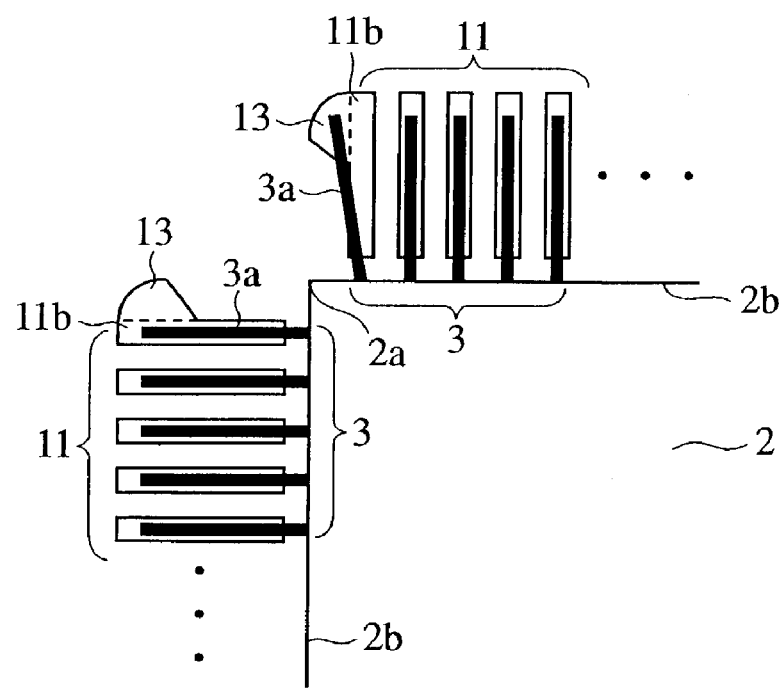
FIG. 2 is a schematic plan view showing a state where multi-pod electric components are mounted on a wiring board device.

FIG. 1 is a schematic plan view showing the purview of a wiring board device of the first embodiment. FIG. 2 is a schematic plan view showing a state where multi-pod electric components are mounted on the wiring board device shown in FIG. 1. In FIG. 1, the same reference numerals as the conventional wiring board device indicate the same components, and therefore descriptions thereof are omitted for brevity s sake.

In the first embodiment, as shown in FIG. 1, at the tip of a strip-shaped marginal land 11*b* of the wiring board device 10 corresponding to a marginal electrode 3*a* of a gull wing type QFP 1 is provided a fanwise partly projecting area 13 that projects in a direction (outside of array) away from another land 11. The partly projecting area 13 and the marginal land 11*a* can be formed simultaneously and in a block by applying solder through a mask (not shown) on which openings corresponding to these shapes are formed.

In the case where the gull wing type QFP 1 is mounted on the wiring board device of this kind, it is feasible to securely contact the marginal electrode 3*a* to the partly projecting area 13 combined with the marginal land 11*b* of the wiring board 10, and to electrically connect them by reflow. Moreover, exceedingly smaller solder to the partly projecting area 13 than the second prior art does by no means produce solder bolls.

As mentioned above, according to the first embodiment, at the tip of the marginal land 11*b* is formed the fanwise partly projecting area 13 in a direction away from another land 11. This ensures an electrical connection to the gull wing type QFP 1, even when the marginal electrode 3*a* bends. Further, the mounting of the multi-pod electric components using a small amount of solder prevents degradation of quality without occurring short circuit due to solder bolls.

Also, according to the first embodiment, the gull wing type QFP is adopted out of the multi-pod electric components as a mounting component. Thus, the partly projecting area 13 does by no means contribute to narrowing of the non-land section 12 corresponding to the corner 2*a* of the gull wing type QFP 1, even when the partly projecting area 13 is formed on the wiring board 10, which secures the liberty of pulling out board patterns.

Second Embodiment

Figure 3:
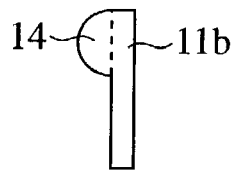
FIG. 3 is a schematic plan view showing the purview of a wiring board device of a second embodiment.

FIG. 3 is a schematic plan view showing the purview of a wiring board device of the second embodiment.

In FIG. 3, the same reference numerals as the conventional wiring board device indicate the same components, and therefore descriptions thereof are omitted for brevity s sake.

Features of the second embodiment is, as shown in FIG. 3, in that a semicircular partly projecting area is provided that projects in a direction (outside of array) away from another land 11 out of the marginal lands 11*b*. The partly projecting area 14 and the marginal land 11*b* can be formed simultaneously and in a block by applying solder through a mask (not shown) on which openings are formed in the form of these shapes.

As mentioned above, according to the second embodiment, the provision of the semicircular partly projecting area 14 on the marginal land 11*b* ensures an electrical connection to the gull wing type QF1, even when the marginal electrode 3*a* bends. Accordingly, the second embodiment takes the similar effect to the first embodiment.

Third Embodiment

Figure 4:
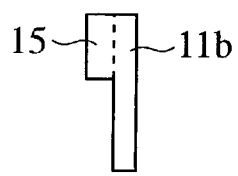
FIG. 4 is a schematic plan view showing the purview of a wiring board device of a third embodiment.

FIG. 4 is a schematic plan view showing the purview of a wiring board device of the third embodiment.

In FIG. 4, the same reference numerals as the conventional board device indicate the same components, and therefore descriptions thereof are omitted for brevity s sake.

Features of the third embodiment is, as shown in FIG. 4, in that a rectangular partly projecting area 15 that projects in a direction (outside of array) away from another land 11 out of the land 11b. The partly projecting area 15 and the marginal land 11b can be formed simultaneously and in a body by applying solder through a mask (not shown) on which openings are formed in the form of these shapes.

As mentioned above, according to the third embodiment, the provision of the rectangular partly projecting area 15 to the land 11b ensures an electrical connection to the gull wing type QFP 1, even when the marginal land 3a bends.

Fourth Embodiment

Figure 5:
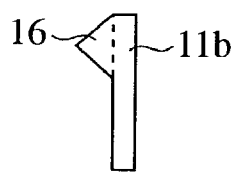
FIG. 5 is a schematic plan view showing the purview of a wiring board device of a fourth embodiment.
Figure 6:
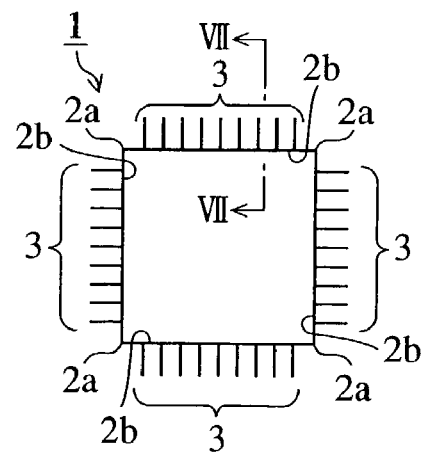
FIG. 6 is schematic plan view showing an external structure of a QFP.
Figure 7:
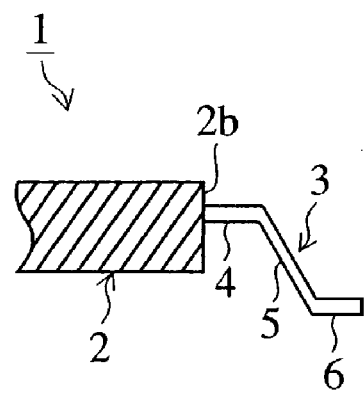
FIG. 7 is a sectional view of FIG. 6 taken along the line VII—VII.
Figure 8:
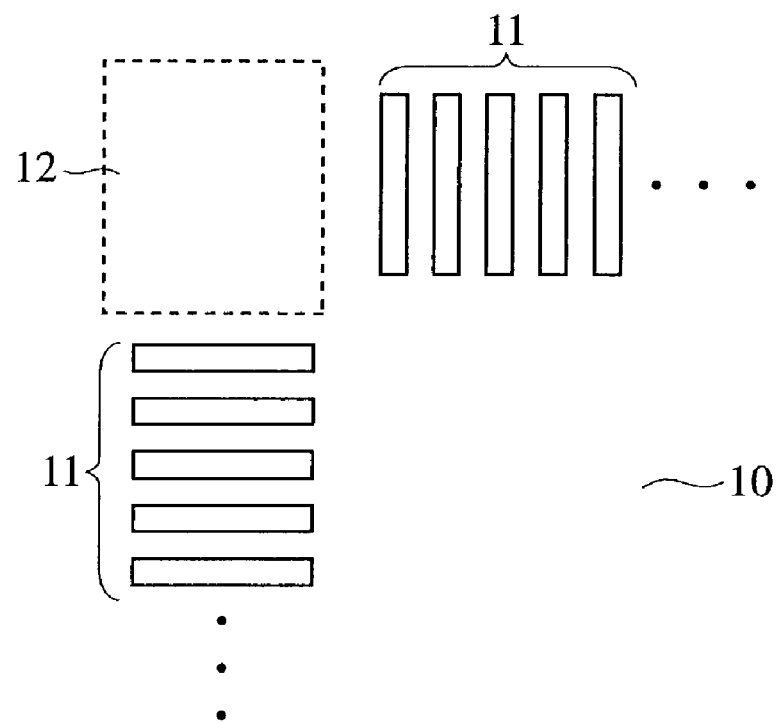
FIG. 8 is a schematic plan view partially showing a structure of a wiring board device of a first prior art.
Figure 9:
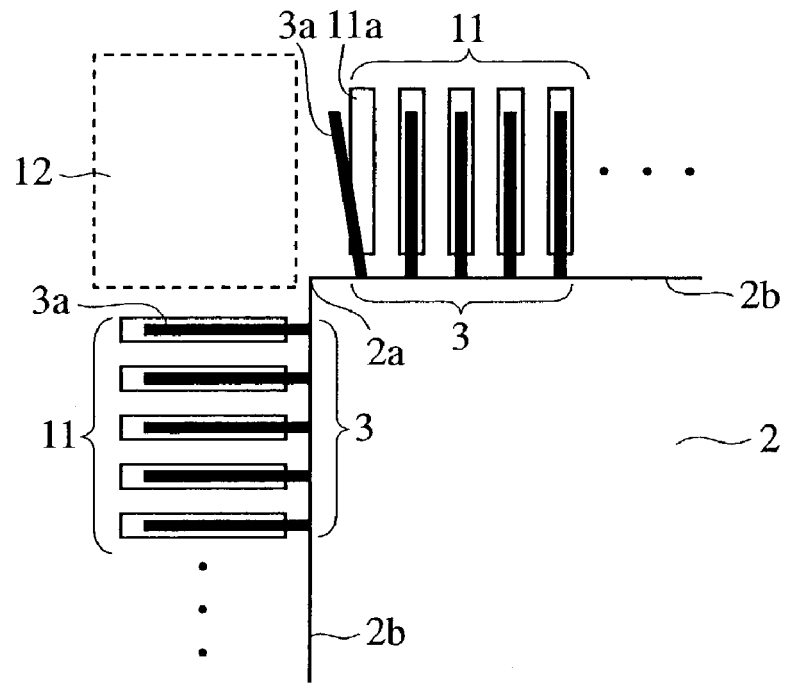
FIG. 9 is a schematic plan view showing a state where the QFP shown in FIGS. 6, 7 is mounted on a wiring board device shown in FIG. 8.
Figure 10:
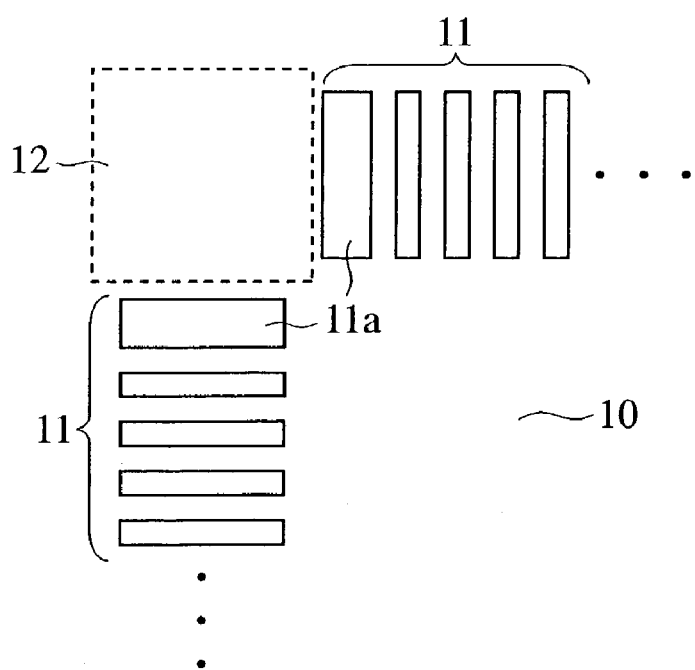
FIG. 10 is schematic plan view partially showing a structure of a wiring board device of a second prior art.
Figure 11:
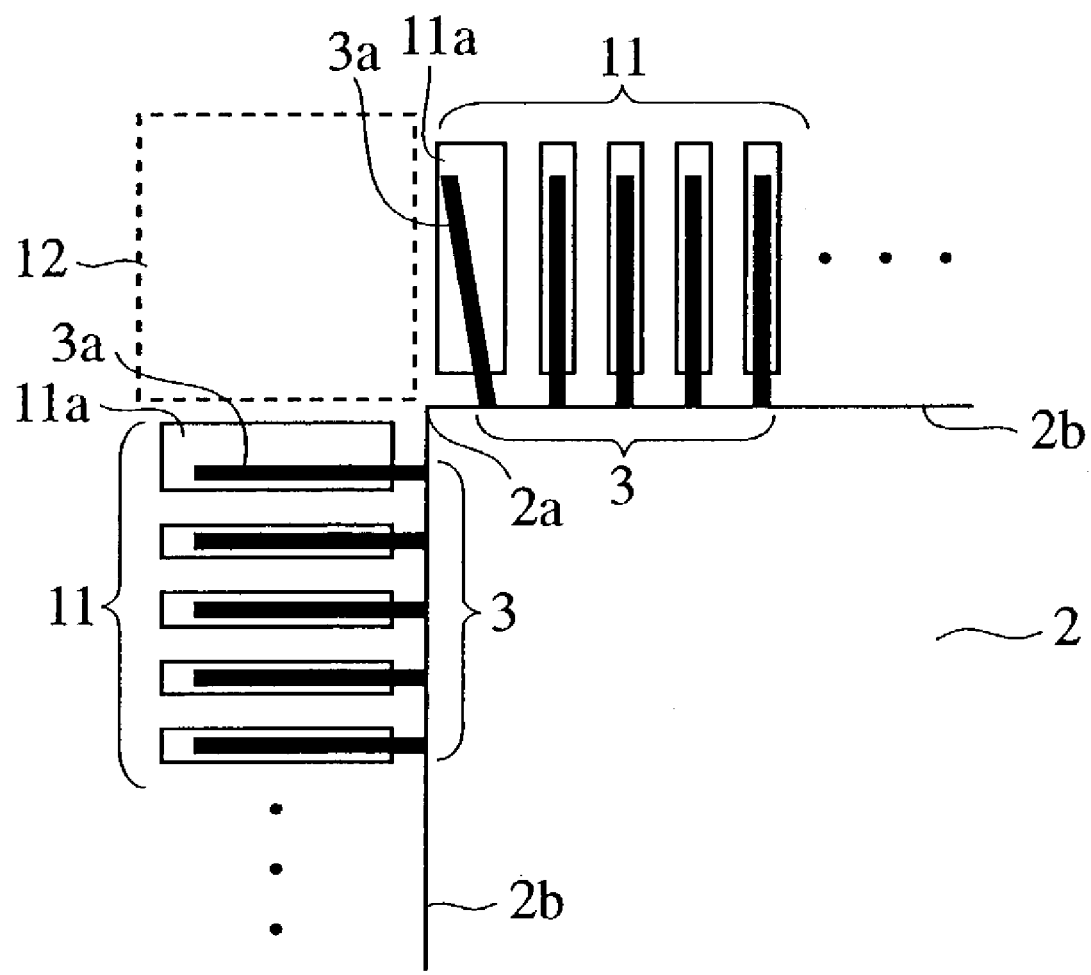
FIG. 11 is a schematic plan view showing a state where the QFP shown in FIGS. 6, 7 is mounted on a wiring board device shown in FIG. 10.

FIG. 5 is a schematic plan view showing the purview of a wiring board device of the fourth embodiment.

In FIG. 5, the same reference numerals as the conventional wiring board device indicate the same components, and therefore descriptions thereof are omitted for brevity s sake.

Features of the fourth embodiment is, as shown in FIG. 5, in that a triangular partly projecting area 16 that projects in a direction (outside of array) away from another land 11 out of the marginal land 11b. The partly projecting area 16 and the marginal land 11b can be formed simultaneously and in a block by applying solder through a mask (not shown) on which openings are formed in the form of these shapes.

As mentioned above, according to the fourth embodiment, the provison of the triangular partly projecting area 16 on the marginal land 11b ensures an electrical connection to the gull wing type QFP 1, even when the marginal electrode 3a bends.

Although in the first to fourth embodiments fanwise, semicircular, rectangular, or triangular partly projecting areas 13 to 16 are formed on the tip of the marginal land 11b, they may, of course, be formed in another shapes. Moreover, the partly projecting area of various shapes may be formed on the same wiring board 10.

Whereas only the gull wing type QFP 1 is admitted as a mounting device in the first to fourth embodiments, this invention is not necessarily limited to the gull wing type QFP, it may be applicable to all IC chips having an arrayed electrode.

While, in the above prior arts and preferred embodiments of the invention, the wiring board device is given as an example, it should be understood by those skilled in the art that various modifications and changes may be made without departing from the sprit and scope of the invention.

Also, it should be noted that the invention meets all the objects mentioned above and also has the advantages of wide commercial utility, and that the invention has been set forth for purposes of illustration only and not of limitation. That is, the invention is limited only by the following claims which follow. Consequently, reference should be made to the following claims in determining the full scope of the invention.

What is claimed is:

1. A wiring board device comprising:
a wiring board for mounting thereon a multi-pod electric component having a plurality of electrodes extending from a first side thereof; and
a plurality of lands, arranged on said wiring board and shaped to electrically connect to said electrodes of said multi-pod electric component, each land comprising an elongated portion extending on an outermost surface of said wiring board between a proximal end, adjacent to an area where the first side of the multi-pod electric component is located when the multi-pod electric component is mounted on the wiring board, and a distal end opposite to the proximal end, wherein:

a marginal land of said plurality of lands comprises a partly projecting area at the distal end of the marginal land, on the outermost surface of said wiring board, that projects in a direction away from remaining ones of said plurality of lands, wherein said partly projecting area of said marginal land is shaped to electrically connect to one of said plurality of electrodes at the time of an occurrence of misalignment due to bending of said electrode, and a non-marginal land of said plurality of lands and the marginal land have equivalent widths at the proximal ends thereof.

2. The wiring board device according to claim 1, wherein said multi-pod electric component comprises a gull wing type Quad Flat Package.

3. The wiring board device according to claim 1, wherein the partly projecting area is arc shaped.

4. The wiring board device according to claim 1, wherein the partly projecting area is semicircularly shaped.

5. The wiring board device according to claim 1, wherein the partly projecting area is rectangularly shaped.

6. The wiring board device according to claim 1, wherein the partly projecting area is triangularly shaped.

7. The wiring board device according to claim 1, wherein the marginal land is strip shaped.

8. The wiring board device according to claim 7, wherein the partly projecting area extends in a direction perpendicular to the length of the strip shaped marginal land, and is arc shaped.

9. The wiring board device according to claim 7, wherein the partly projecting area extends in a direction perpendicular to the length of the strip shaped marginal land, and is semicircularly shaped.

10. The wiring board device according to claim 7, wherein the partly projecting area extends in a direction perpendicular to the length of the strip shaped marginal land, and is rectangularly shaped.

11. The wiring board device according to claim 7, wherein the partly projecting area extends in a direction perpendicular to the length of the strip shaped marginal land, and is triangularly shaped.

12. The wiring board device according to claim 1, wherein:
the elongated portion of each land is of a constant width; and
the partly projecting area is of width greater than the constant width.

13. The wiring board device according to claim 1, wherein gaps between pairs of the plurality of lands are constant between the respective elongated portions thereof.

14. The wiring board device according to claim 1, wherein:
the marginal land electrically connects to a marginal electrode of said electrodes; and
the partly projecting area is shaped to be arranged between a distal end of the marginal electrode and the wiring board throughout a range of bending of the marginal electrode.

15. The wiring board device according to claim 1, wherein said partly projecting area of said marginal land is shaped to electrically connect to one of the plurality of electrodes at the time of the occurrence of misalignment due to an outward bending of said electrode.

16. The wiring board device according to claim 1, wherein a non-marginal land of said plurality of lands and a marginal land of said plurality of marginal lands have at least partially different shapes.

17. The wiring board device according to claim 1, wherein each partly projecting area of a plurality of marginal lands projects in a direction away from remaining ones of said plurality of lands.

18. The wiring board device according to claim 1, wherein the partly projecting area is fan shaped.

19. The wiring board device according to claim 1, wherein a plurality of marginal lands of said plurality of lands comprises a partly projecting area at the distal end of the marginal land, on the outermost surface of said wiring board, that projects in a direction away from remaining ones of said plurality of lands, wherein said partly projecting area projects from a part of the elongated portion of the marginal land that is at least partially between the electrode and the wiring board.

* * * * *